(12) United States Patent
Chen et al.

(10) Patent No.: US 7,229,919 B2
(45) Date of Patent: *Jun. 12, 2007

(54) SEMICONDUCTOR DEVICE HAVING A RANDOM GRAINED POLYSILICON LAYER AND A METHOD FOR ITS MANUFACTURE

(75) Inventors: Chia-Lin Chen, Hsin-Chu (TW); Liang-Gi Yao, Hsin-Chu (TW); Shih-Chang Chen, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 10/870,878

(22) Filed: Jun. 17, 2004

(65) Prior Publication Data

US 2005/0037555 A1    Feb. 17, 2005

Related U.S. Application Data

(63) Continuation-in-part of application No. 10/338,155, filed on Jan. 8, 2003, now Pat. No. 6,780,741.

(51) Int. Cl.
*H01L 21/44* (2006.01)

(52) U.S. Cl. .............................. 438/660; 257/E21.198

(58) Field of Classification Search ................ None
See application file for complete search history.

(56) References Cited

U.S. PATENT DOCUMENTS

| | | |
|---|---|---|
| 5,633,177 A | 5/1997 | Anjum |
| 5,998,289 A | 12/1999 | Sagnes |
| 6,153,534 A | 11/2000 | Long et al. |
| 6,180,499 B1 | 1/2001 | Yu |
| 6,214,681 B1 | 4/2001 | Yu |

OTHER PUBLICATIONS

Bu et al. "Investigation of polycrystalline silicon grain structure with single wafer chemical vapor depostition technique", J. Vac. Sci. Technol. A 19(4), Jul./Aug. 2001.*

* cited by examiner

*Primary Examiner*—Chandra Chaudhari
(74) *Attorney, Agent, or Firm*—Haynes and Boone, LLP

(57) ABSTRACT

A semiconductor device having a random grained polysilicon layer and a method for its manufacture are provided. In one example, the device includes a semiconductor substrate and an insulator layer on the substrate. A first polysilicon layer having a random grained structure is positioned above the insulator layer, a semiconductor alloy layer is positioned above the first polysilicon layer, and a second polysilicon layer is positioned above the semiconductor alloy layer.

25 Claims, 1 Drawing Sheet

SEMICONDUCTOR DEVICE HAVING A RANDOM GRAINED POLYSILICON LAYER AND A METHOD FOR ITS MANUFACTURE

CROSS-REFERENCE

This application is a Continuation-in-Part of U.S. patent application Ser. No. 10/338,155, filed Jan. 8, 2003, now U.S. Pat. No. 6,780,741 assigned to a common assignee, and which is herein incorporated by reference in its entirety.

BACKGROUND

An integrated circuit (IC) is formed by creating one or more devices (e.g., circuit components) on a semiconductor substrate using a fabrication process. As fabrication processes and materials improve, semiconductor device geometries have continued to decrease in size since such devices were first introduced several decades ago. For example, current fabrication processes are producing devices having geometry sizes (e.g., the smallest component (or line) that may be created using the process) of 90 nm and below. However, the reduction in size of device geometries frequently introduces new challenges that need to be overcome.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
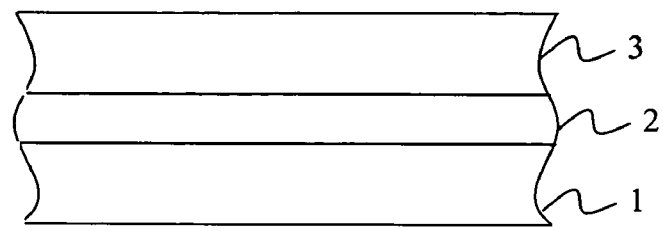
FIGS. 1–4 illustrate sectional views of one embodiment of a semiconductor gate structure during fabrication.

The present disclosure relates generally to semiconductor manufacturing and, more particularly, to a semiconductor device having a random grained polysilicon layer. It is understood, however, that the following disclosure provides many different embodiments or examples. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Micro-miniaturization, or the ability to form semiconductor devices with sub-micron features, has allowed the performance of sub-micron MOSFET devices to be increased while processing costs have decreased. However, as dimensions of specific device features decrease, specific phenomena become significant. For example, gate structures comprised of polysilicon may exhibit a polysilicon depletion effect (PED) that may be evident with narrow width polysilicon gate structures. The polysilicon depletion effect entails distribution of the applied voltage across the polysilicon gate structure as well as across the intended region, the underlying gate insulator layer. The PED phenomena thus may adversely influence device characteristics such as threshold voltage. In addition to the PED phenomena encountered with devices fabricated with sub-micron features, the effect of the surface characteristics of the polysilicon gate structure interfacing the underlying gate insulator layer may also be magnified. For example, a polysilicon layer deposited on an underlying silicon dioxide gate insulator layer may be formed with columnar grains (e.g., grains that extend vertically from the silicon dioxide—polysilicon interface throughout the polysilicon layer). This type of grain structure or surface roughness may be more pronounced for devices having sub-micron gate structures.

Referring to FIG. 1, in one embodiment, a semiconductor substrate 1 may be used as the foundation for a conductive gate structure for a metal oxide semiconductor field effect transistor (MOSFET) device. In the present example, semiconductor substrate 1 includes single crystalline silicon with a <100> crystallographic orientation. Gate insulator layer 2, with an exemplary thickness between about 17 to 135 Angstroms, may be a silicon dioxide layer thermally grown at a temperature between about 800 to 1100° C. in an oxygen-steam ambient.

A polysilicon layer 3, which may be used as a seed layer for deposition of a subsequent overlying layer, may be deposited using a process such as a low pressure chemical vapor deposition (LPCVD) or plasma enhanced CVD (PECVD) procedure. In the present example, the polysilicon layer 3 is deposited at a thickness between about 50 to 300 Angstroms, with the LPCVD procedure performed at a temperature between about 600 to 720° C., using silane or disilane as the source for polysilicon. Polysilicon layer 3 may be doped in situ during deposition via the addition of arsine or phosphine to the silane or disilane ambient, or polysilicon layer 3 may be deposited intrinsically and then doped via implantation of arsenic or phosphorous ions. The deposition procedure may include an in situ hydrogen treatment that enables polysilicon layer 3 to be formed with small, random grains having a grain size between about 6 to 7 nanometers (nm). In the present example, the hydrogen treatment uses a hydrogen concentration of H2/N2 flow from 6%~100%. If the polysilicon layer 3 is deposited without the hydrogen treatment, it may be formed with larger, columnar grains having a grain size between about 12 to 14 nm. In the present example, the crystal orientation of the polysilicon layer 3 is a mixture of <220> and <111> without using the hydrogen treatment and <111> with the hydrogen treatment.

A columnar grained polysilicon layer may present several disadvantages when used as a component of a gate structure. Firstly, the rough top surface of a columnar grained polysilicon layer can result in difficulties in terms of line width control as well as in establishing end point control during a dry etch definition procedure. Secondly, the columnar grains can result in unwanted surface roughness at the polysilicon seed layer—gate insulator layer, adversely influencing carrier mobility. Thirdly, the presence of columnar grains can result in vertical electric scattering, adversely influencing threshold voltage parameters. Accordingly, the ability to form small, random grains via a polysilicon deposition procedure with the in situ hydrogen treatment may provide for enhanced line width control, smoother surfaces, and reduced vertical scattering.

Figure 2:
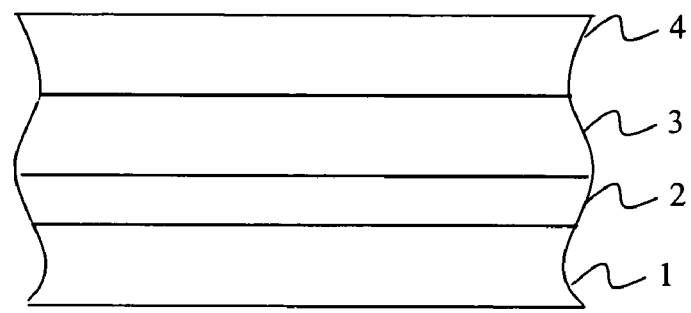

Referring to FIG. 2, a silicon layer 4 (which is a Si—Ge layer in the present embodiment) having a poly-grain structure may be deposited onto the polysilicon layer 3. A polysilicon depletion effect (PED) may adversely influence the activation of dopants in a conductive gate structure if only polysilicon is used as the component of the gate structure. Inadequate dopant activation may result in undesired increases in gate sheet resistance, as well as in the gate depletion effect, which may be evidenced by the distribution of the gate voltage across the polysilicon gate structure. The use of the Si—Ge layer 4 may allow more robust activation of dopants in the defined polysilicon gate structure when compared to counterpart gate structures defined from only polysilicon layers. With the incorporation of germanium in the gate structure allowing lower activation temperatures to be used, the work function and device threshold voltage may be adjusted (e.g., tuned) as a result of the amount of added germanium.

In the present example, the Si—Ge layer 4 may be formed using $Si_{(1-x)}Ge_x$ deposited at a thickness between about 500 and 1000 Angstroms on the underlying polysilicon layer 3. The deposition of this layer may be accomplished using LPCVD procedures at a temperature between about 580 to 620° C., using silane or disilane, and germane as sources for silicon and germanium. The germanium mole fraction (x), determined by the amount of injected germane, influences the work function and thus the threshold voltage of the MOSFET device. An exemplary range for the germanium mole fraction (x) is between about 0.2 and 0.8. $Si_{(1-x)}Ge_x$ layer 4 may be in situ doped during deposition via the addition of amine, phosphine, or diborane to the silane or disilane ambient.

Figure 3:
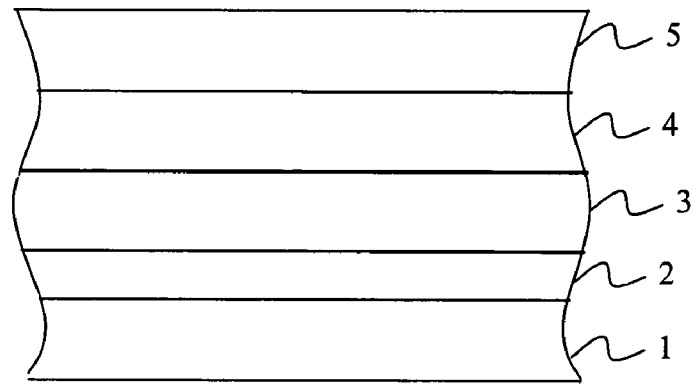

Referring to FIG. 3, to reduce the risk of germanium out gassing, as well as to protect $Si_{(1-x)}Ge_x$ layer 4 from subsequent metal silicide formation, an overlying polysilicon cap layer 5 may be deposited. Polysilicon cap layer 5 may be formed at a thickness between about 500 to 1000 Angstroms via LPCVD procedures at a temperature between about 600 to 720° C. A process used to form polysilicon cap layer 5 may use silane or disilane as a source for polysilicon and, if doping of this layer is desired, such doping may be accomplished via the addition of arsine, phosphine, or diborane to the silane or disilane ambient.

The deposition of polysilicon cap layer 5 may or may not include an in situ hydrogen treatment, such as that performed with respect to polysilicon layer 3, and the polysilicon cap layer 5 may have a random grained or columnar grained structure. If the in situ hydrogen treatment is performed, polysilicon cap layer 5 may be formed with small, random grains having a grain size between about 6 and 7 nm. The small, random grains in turn result in a smooth top surface for polysilicon cap layer 5, allowing improved line width control to be achieved during subsequent conductive gate definition procedures. The inclusion of hydrogen during the growth of polysilicon cap layer 5 (at a temperature between about 600 and 720° C.) allows the desired grain size to be realized while also allowing activation of dopants in $Si_{(1-x)}Ge_x$ layer 4.

Figure 4:
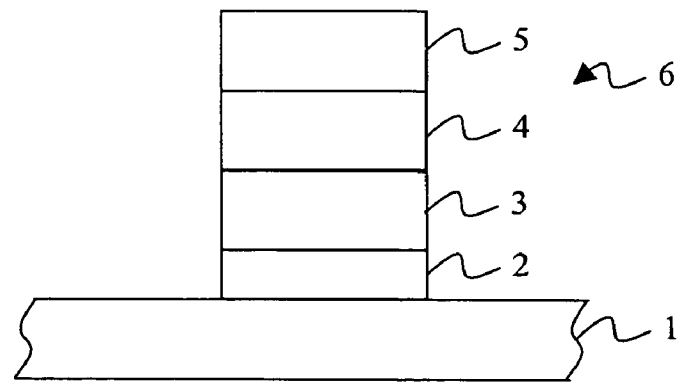

Referring to FIG. 4, a gate structure 6 may be formed with polysilicon cap layer 5, $Si_{(1-x)}Ge_x$ layer 4, and polysilicon layer 3. A photoresist shape, not shown in the drawings, may be used as a mask for an etching procedure, such as an anisotropic reactive ion etching (RIE) procedure using $Cl_2$ or $SF_6$ as an etchant to define gate structure 6. For purposes of illustration, the gate structure 6 may be defined with a width between about 0.09 and 0.24 um. After removal of the photoresist shape via a process such as plasma oxygen ashing, a cleaning procedure (e.g., a wet clean procedure using a buffered hydrofluoric acid component) may be employed to remove portions of gate insulator layer 2 not covered by gate structure 6. It is understood that the ability to define the narrow width of gate structure 6 may be enhanced via the presence of the smooth surface of polysilicon cap layer 5, while device characteristics such as carrier mobility may benefit from the smooth surface of polysilicon layer 3. In addition, the ability to reduce polysilicon depletion may be provided via the addition of germanium to the silicon layer 4, located between overlying polysilicon cap layer 5 and underlying polysilicon layer 3.

The foregoing has outlined features of an embodiment so that those skilled in the art may better understand the detailed description. Those skilled in the art should understand that all spatial references herein are for the purpose of example only and are not meant to limit the disclosure. Those skilled in the art should also appreciate that they may readily use the present disclosure as a basis for designing or modifying other processes and structures for carrying out the same purposes and/or achieving the same advantages of the embodiments introduced herein. Those skilled in the art should further realize that such equivalent constructions do not depart from the spirit and scope of the present disclosure, and that they may make various changes, substitutions and alterations herein without departing from the spirit and scope of the present disclosure.

What is claimed is:

1. A method for fabricating a structure for a semiconductor device, the method comprising:
   forming an insulator layer on a semiconductor substrate;
   forming a random grained polysilicon layer directly on the insulator layer, wherein forming the random grained polysilicon layer includes using a hydrogen treatment;
   forming an alloy layer above the random grained polysilicon layer; and
   forming a semiconductor layer above the alloy layer, wherein the semiconductor layer is a polysilicon layer.

2. The method of claim 1 wherein the hydrogen treatment is an in situ hydrogen treatment.

3. The method of claim 2 wherein the hydrogen treatment results in small, random grains having a grain size between about 6 and 7 nm.

4. The method of claim 2 wherein the random grained polysilicon layer is formed using a chemical vapor deposition (CVD) process at a temperature between about 600 and 720° C. and using silane or disilane as reactants.

5. The method of claim 4 wherein the CVD process is a low pressure chemical vapor deposition (LPCVD) process.

6. The method of claim 1 wherein the random grained polysilicon layer is formed to a thickness between about 50 and 300 Angstroms.

7. The method of claim 1 further comprising doping the random grained polysilicon layer in situ.

8. The method of claim 7 wherein the doping is accomplished via the addition of arsine, phosphine, or diborane to a silane or disilane ambient used in forming the random grained polysilicon layer.

9. The method of claim 1 wherein the alloy layer is formed as a $Si_{(1-x)}Ge_x$ layer, wherein the content (x) of germanium, described as mole fraction, is between about 0.2 to 0.8.

10. The method of claim 9 wherein forming the alloy layer includes using a CVD process using silane or disilane as a silicon source and using germane as a germanium source.

11. The method of claim 10 wherein the alloy layer is formed to a thickness between about 500 and 1000 Angstroms.

12. The method of claim 1 further comprising doping the alloy layer in situ, wherein the doping is accomplished during deposition via the addition of arsine, phosphine, or diborane, to a silane or disilane, and germane ambient.

13. The method of claim 1 wherein the semiconductor layer comprises a random grained polysilicon.

14. The method of claim 13 wherein forming the semiconductor layer includes using an in situ hydrogen treatment.

15. The method of claim 1 wherein the semiconductor layer comprises a columnar grained polysilicon.

16. The method of claim 1 further comprising patterning the random grained polysilicon layer, the alloy layer, and the semiconductor layer to form a gate structure on the insulator layer.

17. A method for forming a gate structure for a MOSFET device, the method comprising:
   forming a gate dielectric layer on a semiconductor substrate;
   forming a first polysilicon layer comprised of random grains on the gate dielectric layer, wherein the forming includes using an in situ hydrogen treatment;
   forming a silicon-germanium (Si—Ge) layer on the first polysilicon layer;
   forming a second polysilicon layer; and
   performing a patterning procedure to define the gate structure.

18. The method of claim 17, wherein forming the first polysilicon layer includes using a low pressure chemical vapor deposition (LPCVD) procedure using silane or disilane as reactants.

19. The method of claim 17 further comprising doping the first polysilicon layer during formation via the addition of arsine, phosphine, or diborane to a silane or disilane ambient.

20. The method of claim 17, wherein forming the first polysilicon layer includes using a LPCVD or PECVD procedure at a temperature between about 600 and 720° C. using silane or disilane as a source for polysilicon.

21. The method of claim 17 wherein forming the Si—Ge layer includes using an LPCVD procedure, using silane or disilane as a silicon source, and using germane as a germanium source.

22. The method of claim 17 further comprising doping the Si—Ge layer during formation via the addition of arsine, phosphine, or diborane, to a silane or disilane, and germane ambient.

23. The method of claim 17, wherein forming the second polysilicon layer includes using a low pressure chemical vapor deposition (LPCVD) procedure, using silane or disilane as a source for polysilicon.

24. The method of claim 17, wherein forming the second polysilicon layer includes using a CVD process at a temperature between about 600 to 720° C., using silane or disilane as a source for polysilicon.

25. The method of claim 17 wherein the second polysilicon layer is formed with random or columnar grains.

* * * * *